(12) United States Patent
Morikita et al.

(10) Patent No.: US 10,192,750 B2
(45) Date of Patent: Jan. 29, 2019

(54) PLASMA PROCESSING METHOD

(71) Applicant: TOKYO ELECTRON LIMITED, Tokyo (JP)

(72) Inventors: Shinya Morikita, Miyagi (JP); Ryosuke Niitsuma, Miyagi (JP); Weichien Chen, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/605,531

(22) Filed: May 25, 2017

(65) Prior Publication Data

US 2017/0345666 A1 Nov. 30, 2017

(30) Foreign Application Priority Data

May 26, 2016 (JP) .................. 2016-105084

(51) Int. Cl.
| | |
|---|---|
| H01L 21/311 | (2006.01) |
| H01L 21/3065 | (2006.01) |
| H01J 37/32 | (2006.01) |
| H01L 21/308 | (2006.01) |
| H01L 21/67 | (2006.01) |

(Continued)

(52) U.S. Cl.
CPC ...... H01L 21/3065 (2013.01); H01J 37/3255 (2013.01); H01J 37/32449 (2013.01); H01J 37/32532 (2013.01); H01J 37/32541 (2013.01); H01J 37/32559 (2013.01); H01J 37/32568 (2013.01); H01J 37/32715 (2013.01); H01L 21/0273 (2013.01); H01L 21/3081 (2013.01); H01L 21/3086 (2013.01); H01L 21/31116 (2013.01); H01L 21/31138 (2013.01); H01L 21/31144 (2013.01); H01L 21/32139 (2013.01); H01L 21/67069 (2013.01);

(Continued)

(58) Field of Classification Search
CPC .......... H01L 21/3081; H01L 21/31056; H01L 21/31144; H01L 21/3065; H01L 21/31116; H01L 21/31138; H01L 21/67069
USPC ................ 438/695, 714, 717, 723, 736, 743
See application file for complete search history.

(56) References Cited

U.S. PATENT DOCUMENTS

| | | | | |
|---|---|---|---|---|
| 2011/0250761 A1* | 10/2011 | Lee | ................... | H01L 21/31144 438/717 |
| 2016/0351799 A1* | 12/2016 | Xue | ........................ | H01L 43/12 |
| 2017/0243756 A1* | 8/2017 | Matsuura | ............ | H01L 21/3065 |

FOREIGN PATENT DOCUMENTS

JP 2013-42149 A 2/2013

* cited by examiner

*Primary Examiner* — Binh X Tran
(74) *Attorney, Agent, or Firm* — Rothwell, Figg, Ernst & Manbeck, P.C.

(57) ABSTRACT

Disclosed is a plasma processing method for processing a workpiece that includes: a silicon-containing etching target layer, an organic film provided on the etching target layer, an antireflective film provided on the organic layer, and a first mask provided on the antireflective layer, using a plasma processing apparatus having a processing container. The plasma processing method includes: etching the antireflective film using plasma generated in the processing container and the first mask to form a second mask from the antireflective film; etching the organic film using plasma generated in the processing container and the second mask to form a third mask from the organic film; generating plasma of a mixed gas including the first gas and the second gas in the (Continued)

processing container; and etching the etching target layer using plasma generated in the processing container and the third mask.

6 Claims, 5 Drawing Sheets

(51) Int. Cl.
*H01L 21/027* (2006.01)
*H01L 21/3213* (2006.01)
*H01L 21/683* (2006.01)

(52) U.S. Cl.
CPC . *H01J 37/32724* (2013.01); *H01J 2237/3341* (2013.01); *H01L 21/67109* (2013.01); *H01L 21/6831* (2013.01)

PLASMA PROCESSING METHOD

CROSS-REFERENCE TO RELATED APPLICATIONS

This application is based on and claims priority from Japanese Patent Application No. 2016-105084 filed on May 26, 2016 with the Japan Patent Office, the disclosure of which is incorporated herein in its entirety by reference.

TECHNICAL FIELD

An exemplary embodiment of the present disclosure relates to a plasma processing method.

BACKGROUND

In manufacturing electronic devices such as semiconductor devices, a plasma processing is performed using a plasma processing apparatus. An exemplary type of the plasma processing is etching of a silicon film. As a plasma processing apparatus used for etching a silicon-containing film, there has been known, for example, a plasma processing apparatus disclosed in Japanese Patent Laid-Open Publication No. 2013-42149.

Japanese Patent Laid-Open Publication No. 2013-42149 also discloses a method of protecting a surface of a silicon or silicon carbide electrode from morphological modification during a plasma etching processing. The method disclosed in Japanese Patent Laid-Open Publication No. 2013-42149 is directed to forming a protective polymer coating on the silicon or silicon carbide electrode of a plasma processing chamber and may be implemented during a process of cleaning a plasma processing chamber or during a process of etching a semiconductor substrate in the plasma processing chamber.

Further, the plasma processing apparatus disclosed in Japanese Patent Laid-Open Publication No. 2013-42149 includes a plasma processing chamber, a substrate support, and an upper electrode. The substrate support is provided in the plasma processing chamber and configured to support a workpiece in the plasma processing chamber. The upper electrode contains silicon and is provided above the substrate support to face the substrate support. The substrate support includes an electrostatic chuck. In the plasma processing apparatus, the electrostatic chuck constitutes a lower electrode.

SUMMARY

According to an aspect, there is provided a plasma processing method for processing a workpiece using a plasma processing apparatus. The plasma processing apparatus includes a processing container. The workpiece includes a silicon-containing etching target layer, an organic film provided on the etching target layer, an antireflective film provided on the organic layer, and a first mask provided on the antireflective layer. The plasma processing method includes: etching the antireflective film using plasma generated in the processing container and the first mask to form a second mask from the antireflective film (step a); etching the organic film using the plasma generated in the processing container and the second mask to form a third mask from the organic film (step b); generating plasma of a mixed gas including a first gas and a second gas in the processing container (step c); and etching the etching target layer using the plasma generated in the processing container and the third mask (step d). The plasma processing apparatus further includes an upper electrode. The upper electrode is provided above a placing table that supports the workpiece in the processing container. An electrode plate of the upper electrode contains silicon. The first gas is oxygen gas. In step c, a silicon oxide film is formed on a surface of the electrode plate by colliding oxygen ions contained in the plasma of the first gas with the electrode plate.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
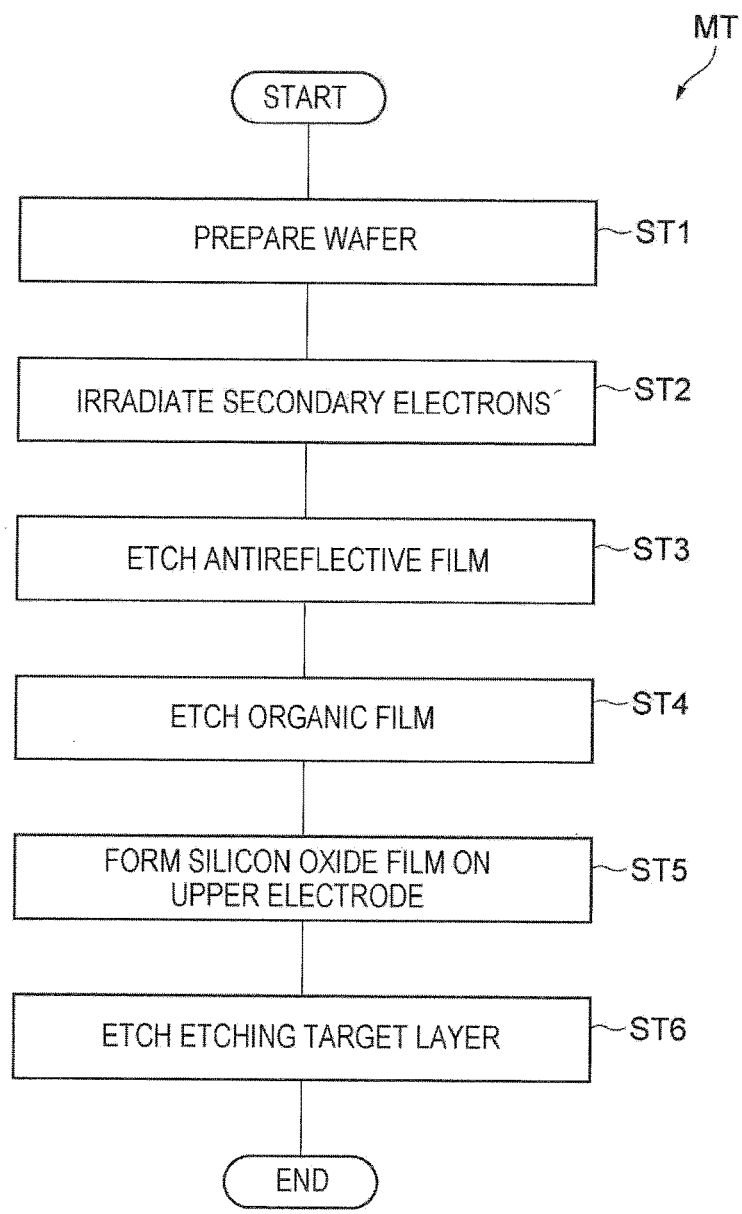
FIG. 1 is a flowchart illustrating a method according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Recently, demand for an etching processing for a silicon-containing film has increased. However, in the plasma processing apparatus that performs the process, a plurality of members (e.g., the above-described upper electrode) may contain silicon. Changes in the state of the silicon-containing upper electrode may influence process characteristics. Therefore, what is required is to implement a plasma processing method capable of avoiding any influence on the silicon-containing upper electrode in the etching process of the silicon-containing film and maintaining the state of the upper electrode.

According to an aspect, the present disclosure provides a plasma processing method for processing a workpiece using a plasma processing apparatus. The plasma processing apparatus includes a processing container. The workpiece includes a silicon-containing etching target layer, an organic film provided on the etching target layer, an antireflective film provided on the organic layer, and a first mask provided on the antireflective layer. The plasma processing method includes: etching the antireflective film using plasma generated in the processing container and the first mask to form a second mask from the antireflective film (step a); etching the organic film using the plasma generated in the processing container and the second mask to form a third mask from the organic film (step b); generating plasma of a mixed gas including a first gas and a second gas in the processing container (step c); and etching the etching target layer using the plasma generated in the processing container and the third mask (step d). The plasma processing apparatus further includes an upper electrode. The upper electrode is provided above a placing table that supports the workpiece in the processing container. An electrode plate of the upper electrode contains silicon. The first gas is oxygen gas. In step c, a silicon oxide film is formed on a surface of the electrode plate by colliding oxygen ions contained in the plasma of the first gas with the electrode plate.

According to this aspect, since the silicon oxide film is formed on the electrode plate of the upper electrode during the time period after the execution of step c before the execution of step d, it is unnecessary to provide a step of forming a silicon oxide film on the electrode plate of the upper electrode in advance before execution of step a. In addition, it is unnecessary to prepare another wafer used for forming a silicon oxide film on the electrode plate of the upper electrode, in addition to the wafer subjected to step a. Further, it is possible to avoid any influence on a seasoning process to be performed before the execution of step a. Further, since oxygen ions collide with the silicon-containing electrode plate in accordance with the DC voltage applied from the electrode plate, oxygen ions are selectively supplied to the electrode plate. Therefore, it is possible to reduce the influence of oxygen ions on other parts in the processing container other than the electrode plate. In addition, it is possible to reduce variations in film thickness of the silicon oxide film formed on the electrode plate.

In an exemplary embodiment, in the generating the plasma of the mixed gas, a flow rate of the first gas may be 3 sccm to 10 sccm. When the flow rate of the first gas falls within the range, it is possible to form the silicon oxide film relatively thick on the electrode plate and reduce the influence of the oxygen ions from the plasma of the first gas on the organic film of the third mask.

In an exemplary embodiment, the second gas may be argon gas. Therefore, oxidation of silicon in the electrode plate may be effectively performed by using the second gas which is argon gas together with the first gas which is oxygen gas.

In an exemplary embodiment, the antireflective film may contain silicon oxide, and a film thickness of the silicon oxide film formed in step c may be a film thickness of the silicon oxide film to be removed in step a when step a is further performed after step d. Since the film thickness of the silicon oxide film that may be formed in step c is equal to or greater than the film thickness necessary for protecting the electrode plate in the etching processing of step d and is equal to or less than the film thickness to be removed in step a when step a is further performed after step d, the silicon oxide film may be used as a protective film, and the silicon oxide film may be efficiently removed after use.

As described above, it is possible to implement a plasma processing method capable of avoiding any influence on the silicon-containing upper electrode in the etching process of the silicon-containing film and maintaining the state of the upper electrode.

Hereinafter, various exemplary embodiments will be described in detail with reference to drawings. Meanwhile, in the respective drawings, the same or corresponding parts will be denoted by the same symbols.

Figure 2A:
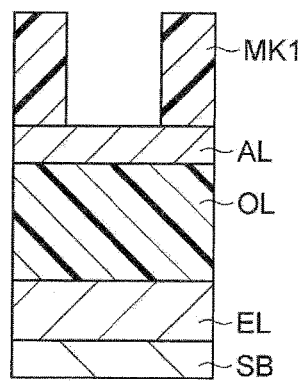
FIG. 2A is a cross-sectional view illustrating an exemplary workpiece to which the method illustrated in FIG. 1 is applied.

FIG. 1 is a flowchart illustrating a plasma processing method according to an exemplary embodiment. Method MT illustrated in FIG. 1 is an exemplary embodiment of the plasma processing method. FIG. 2A is a cross-sectional view illustrating an exemplary workpiece to which method MT illustrated in FIG. 1 is applied (hereinafter, referred to as a "wafer W").

First, the configuration of the wafer W to which method MT is applied will be described with reference to FIG. 2A. The wafer W illustrated in FIG. 2A includes a substrate SB, an etching target layer EL, an organic film OL, an antireflective film AL, and a mask MK1 (first mask). The etching target layer EL is formed on the substrate SB. The etching target layer EL contains silicon, and may be, for example, an amorphous silicon layer or polycrystalline silicon layer. The organic film OL is made of an organic material, and is provided on the etching target layer EL. The antireflective layer AL contains silicon oxide, and is provided on the organic film OL. The mask MK1 is provided on the antireflective film AL. The mask MK1 is made of an organic material, and is, for example, a resist mask. The mask MK1 has a pattern formed by photolithography to provide an opening.

Figure 3:
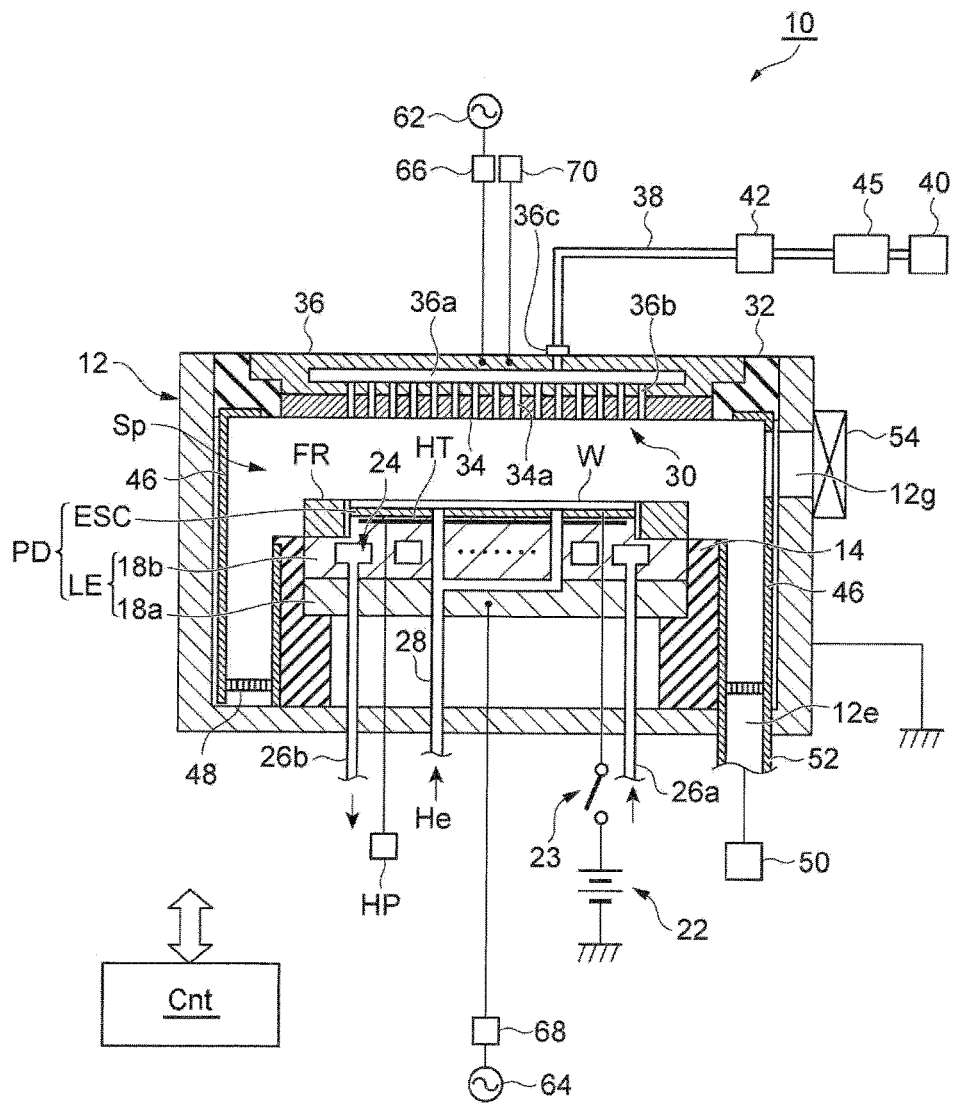
FIG. 3 is a view illustrating an exemplary plasma processing apparatus that may be used for performing the method illustrated in FIG. 1.

Next, the configuration of a plasma processing apparatus that may be used for performing method MT will be described. The method MT is performed by the plasma processing apparatus. FIG. 3 is a view illustrating an exemplary plasma processing apparatus that may be used for performing method MT illustrated in FIG. 1. FIG. 3 schematically illustrates a cross-sectional structure of a plasma processing apparatus 10 that may be used in various exemplary embodiments of method MT.

As illustrated in FIG. 3, the plasma processing apparatus 10 is a plasma etching apparatus having parallel flat electrodes, and includes a processing container 12. The processing container 12 has a substantially cylindrical shape and defines a processing space Sp. The processing container 12 is made of, for example, aluminum, and the inner wall surface of the processing container 12 is subjected to an anodizing treatment. The processing container 12 is grounded for safety.

A substantially cylindrical support 14 is provided above the bottom portion of the processing container 12. The support 14 is made of, for example, an insulating material. The insulating material constituting the support 14 may include oxygen like quartz. The support 14 extends vertically from the bottom portion of the processing container 12 in the processing container 12 (upward from the bottom portion of the processing container 12 in the processing container 12). A placing table PD is provided in the processing container 12. The placing table PD is supported by the support 14.

The placing table PD holds the wafer W on the top surface thereof. A main surface FW of the wafer W is on the opposite side to the rear surface of the wafer W which is in contact with the top surface of the placing table PD and faces the upper electrode 30. The placing table PD includes a lower electrode LE and an electrostatic chuck ESC. The lower electrode LE includes a first plate 18*a* and a second plate 18*b*. The first plate 18*a* and the second plate 18*b* are made of a metal such as, for example, aluminum, and have a substantially disc shape. The second plate 18*b* is provided on the first plate 18*a* and electrically connected to the first plate 18*a*.

The electrostatic chuck ESC is provided on the second plate 18*b*. The electrostatic chuck ESC has a structure in which an electrode made of a conductive film is disposed between a pair of insulating layers or insulating sheets. The electrode of the electrostatic chuck ESC is electrically connected with a DC power source 22 via a switch 23. When the wafer W is placed on the placing table PD, the wafer W is in contact with the electrostatic chuck ESC. The wafer W is in contact with the electrostatic chuck ESC. The electrostatic chuck ESC attracts the wafer W through an electrostatic force such as, for example, a Coulomb force caused by a DC voltage from the DC power source 22. Therefore, the electrostatic chuck ESC is capable of holding the wafer W.

A focus ring FR is disposed on the periphery of the second plate 18b to surround the edge of the wafer W and the electrostatic chuck ESC. The focus ring FR is provided to enhance the uniformity of the etching. The focus ring FR is made of a material appropriately selected from materials of an etching target film, and may be made of, for example, quartz.

A coolant flow path 24 is provided inside the second plate 18b. The coolant flow path 24 constitutes a temperature adjustment mechanism. The coolant flow path 24 is supplied with a coolant from a chiller unit (not illustrated) provided outside the processing container 12 through a pipe 26a. The coolant supplied to the coolant flow path 24 is returned to the chiller unit through a pipe 26b. In this manner, the coolant is supplied to the coolant flow path 24 to circulate therethrough. The temperature of the wafer W supported by the electrostatic chuck ESC is controlled by controlling the temperature of the coolant.

A gas supply line 28 is provided in the plasma processing apparatus 10. The gas supply line 28 supplies a heat transfer gas, for example, helium (He) gas from a heat transfer gas supply mechanism to a gap between the top surface of the electrostatic chuck ESC and the rear surface of the wafer W.

A heater HT is provided in the plasma processing apparatus 10 to adjust the temperature of the wafer W. The heater HT is embedded in the electrostatic chuck ESC or embedded in the second plate 18b. The heater HE is connected with a heater power source HP. When power is supplied from the heater power source HP to the heater HP, the temperature of the electrostatic chuck ESC is adjusted, so that the temperature of the wafer W placed on the electrostatic chuck ESC is adjusted.

The plasma processing apparatus 10 includes an upper electrode 30. The upper electrode 30 is provided above the placing table PD in the processing container 12 to face the placing table PD. The lower electrode LE and the upper electrode 30 are provided substantially in parallel with each other and constitute a parallel plate electrode. A processing space Sp is provided between the upper electrode 30 and the lower electrode LE to perform a plasma processing on the wafer W.

The upper electrode 30 is supported in the upper portion of the processing container 12 through an insulating shielding member 32. The insulating shielding member 32 is made of an insulating material and may include, for example, oxygen, like quartz. The upper electrode 30 may include an electrode plate 34 and an electrode support 36. The electrode plate 34 faces the processing space Sp, and a plurality of gas ejection holes 34a are provided in the electrode plate 34. In an exemplary embodiment, the electrode plate 34 contains silicon.

The electrode support 36 detachably supports the electrode plate 34, and may be made of a conductive material such as, for example, aluminum. The electrode support 36 may have a water-cooled structure. A gas diffusion chamber 36a is provided inside the electrode support 36. A plurality of gas flowing holes 36b extend downward from the gas diffusion chamber 36a (in a direction toward the placing table PD in the processing container 12) to be in communication with the gas ejection holes 34a, respectively. The electrode support 36 includes a gas introduction port 36c that introduces the processing gas to the gas diffusion chamber 36a. The gas introduction port 36c is connected with a gas supply pipe 38.

The gas supply pipe 38 is connected with a gas source group 40 via a valve group 42 and a flow rate controller group 44. The gas source group 40 includes a plurality of gas sources. The plurality of gas sources may include, for example, a source of a fluorocarbon-based gas ($C_xF_y$ gas (x and y are an integer of 1 to 10)), a source of oxygen gas, a source of nitrogen gas, a source of hydrogen gas, a source of a halogen-containing gas, and a rare gas. Examples of the halogen-containing gas which may be used herein include HBr gas, $Cl_2$ gas, $SF_6$ gas, $BCl_3$ gas, and $NF_3$ gas. Examples of the rare gas which may be used herein include argon (Ar) gas.

The valve group 42 includes a plurality of valves, and the flow rate controller group 44 includes a plurality of flow rate controllers such as, for example, mass flow controllers. The plurality of gas sources of the gas source group 40 are connected to the gas supply pipe 38 via valves corresponding to the valve group 42 and the flow rate controllers corresponding to the flow rate controller group 44, respectively. Therefore, the plasma processing apparatus 10 may supply the gases from one or more gas sources selected among the plurality of gas sources of the gas source group 40 into the processing container 12 at individually adjusted flow rates.

Further, in the plasma processing apparatus 10, a deposit shield 46 is provided detachably along the inner wall of the processing container 12. The deposit shield 46 is provided in the outer periphery of the support 14 as well. The deposit shield 46 serves to suppress any etching byproduct (deposit) from being attached to the processing container 12, and may be formed by coating an aluminum material with a ceramic (e.g., $Y_2O_3$). The deposit shield 46 may be made of a material containing oxygen such as, for example, quartz, in addition to $Y_2O_3$.

An exhaust plate 48 is provided at the bottom portion side of the processing container 12 between the support 14 and the sidewall of the processing container 12. The exhaust plate 48 may be formed by coating an aluminum material with a ceramic (e.g., $Y_2O_3$). An exhaust port 12e is formed at the lower side of the exhaust plate 48 in the processing container 12. An exhaust port 12e is connected with an exhaust device 50 via an exhaust pipe 52. The exhaust device 50 includes a vacuum pump such as, for example, a turbo molecular pump, and is capable of decompressing the space in the processing container 12 to a desired degree of vacuum. A carry-in/out port 12g of the wafer W is formed in the sidewall of the processing container 12. The carry-in/out port 12g is configured to be opened/closed by a gate valve 54.

Further, the plasma processing apparatus 10 further includes a first high frequency power source 62 and a second high frequency power source 64. The first high frequency power source 62 is a power source for generating a first high frequency power for plasma generation. The first high frequency source generates a high frequency power with a frequency of 27 MHz to 100 MHz, for example, 60 MHz. Further, the first high-frequency power source 62 has a pulse specification and may be controlled at a frequency of 5 kHz to 10 kHz and a duty of 50% to 100%. The first high frequency power source 62 is connected to the upper electrode 30 via a matcher 66. The matcher 66 is a circuit to match the output impedance of the first high frequency power source 62 and the input impedance of the load side (the lower electrode LE side). The first high frequency power source 62 may be connected to the lower electrode LE via the matcher 66.

The second high frequency power source 64 is a power source for generating a second high frequency power for drawing ions into the wafer W, that is, a high frequency bias power. The second high frequency power source 64 generates a high frequency bias power with a frequency of 400 kHz to 40.65 MHz, for example, 13.56 MHz. Further, the second high-frequency power source 64 has a pulse specification and may be controlled at a frequency of 5 kHz to 40 kHz and a duty of 20% to 100%. The second high frequency power source 64 is connected to the lower electrode LE via a matcher 68. The matcher 68 is a circuit to match the output impedance of the first high frequency power source 64 and the input impedance of the load side (the lower electrode LE side).

The plasma processing apparatus 10 further includes a power source 70. The power source 70 is connected to the upper electrode 30. The power source 70 applies a voltage to the upper electrode 30 to draw positive ions present in the processing space Sp into the electrode plate 34. In an example, the power source 70 is a DC power source that generates a negative DC voltage. When such a voltage is applied from the power source 70 to the upper electrode 30, positive ions present in the processing space Sp collide with the electrode plate 34. Accordingly, secondary electrons and/or silicon may be released from the electrode plate 34.

The controller Cnt is a computer including, for example, a processor, a storage unit, an input device, and a display device, and controls respective parts of the plasma processing apparatus 10. Specifically, the controller Cnt is connected to the valve group 42, the flow rate controller group 45, the exhaust device 50, the first high frequency power source 62, the matcher 66, the second high frequency power source 64, the matcher 68, the power source 70, the heater power source HP, and the chiller unit.

The control unit Cnt operates in accordance with a program based on the input recipe and transmits a control signal. The control signal from the controller Cnt enables the selection of a gas supplied from the gas source group 40 and the control of the flow rate of the gas supplied from the gas source group 40, the exhaust of the exhaust device 50, the power supply from the first high frequency power supply 62 and the second high frequency power supply 64, the voltage application from the power source 70, the power supply of the heater power source HP, and the flow rate and temperature of the coolant from the chiller unit. Each step of the plasma processing method (method MT) disclosed in the specification may be executed by operating each part of the plasma processing apparatus 10 under the control of the controller Cnt.

Figure 2B:
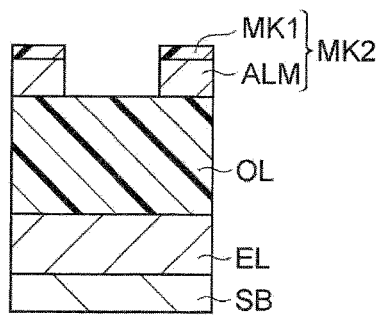
FIGS. 2B to 2D are cross-sectional views illustrating a state of the workpiece after each step of the method illustrated in FIG. 1.
Figure 2C:
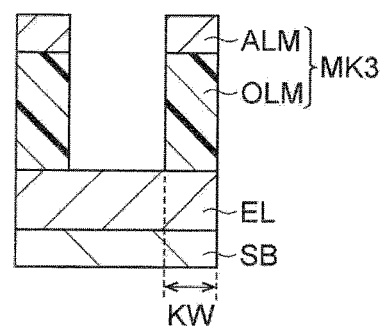
Figure 2D:
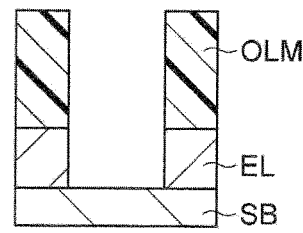
Figure 4:
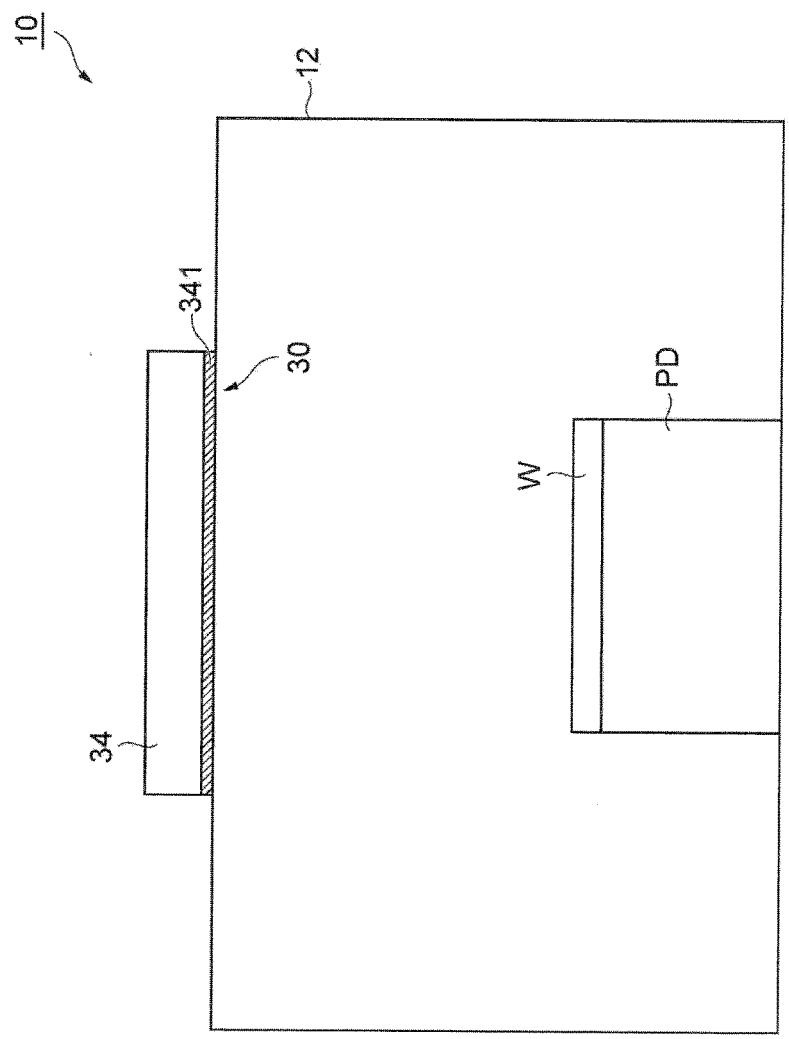
FIG. 4 is a view schematically illustrating a state of the processing container during the performance of the method illustrated in FIG. 1.

Referring back to FIG. 1, method MT will be described in detail. Hereinafter, descriptions will be made on an example in which the plasma processing apparatus 10 is used to implement method MT. Further, in the following descriptions, reference will be further made to FIGS. 2B to 2D and 4 together with FIG. 2A. FIGS. 2B to 2D are cross-sectional views each illustrating a state of the wafer W after each step of method MT illustrated in FIG. 1. FIG. 4 is a view schematically illustrating a state of the processing container during the performance of the method illustrated in FIG. 1.

In step ST1, after a seasoning process on the inside of the processing container 12, the wafer W illustrated in FIG. 2A is prepared. Then, the wafer W is accommodated in the processing container 12 of the plasma processing apparatus 10 and placed on the electrostatic chuck ESC. After the wafer W illustrated in FIG. 2A is prepared as a wafer W illustrated in FIG. 3 in step ST1, each step after step ST2 is executed.

In step ST2 subsequent to step ST1, secondary electrons are irradiated to the wafer W. Specifically, hydrogen gas and a rare gas are supplied into the processing container 12, and high frequency power is supplied from the first high frequency power source 62, so that plasma is generated. In addition, a negative DC voltage is applied to the upper electrode 30 by the power source 70. As a result, positive ions in the processing space Sp are drawn into the upper electrode 30, and the positive ions collide with the upper electrode 30. As positive ions collide with the upper electrode 30, secondary electrons are released from the upper electrode 30. As the released secondary electrons are irradiated to the wafer W, the mask MK1 is modified. When the level of the absolute value of the negative DC voltage applied to the upper electrode 30 is high, positive ions collide with the electrode plate 34 so that silicon, which is a constituent material of the electrode plate 34, is released together with the secondary electrons. The released silicon is bonded with oxygen released from the components of the plasma processing apparatus 10 exposed to the plasma. The oxygen is released from members such as, for example, the support 14, the insulating shielding member 32, and the deposit shield 46. A silicon oxide compound is produced by the bonding of the silicon and the oxygen, and the silicon oxide compound is deposited on the wafer W to cover and protect the mask MK1. Damage to the mask MK1 due to subsequent processings may be suppressed by the modification and protection effects. In step ST2, the bias power of the second high frequency power supply 64 may be minimized to suppress the release of silicon in order to perform modification by irradiation with the secondary electrons and formation of the protective film.

In step ST3 subsequent to step ST2, the antireflective film AL is etched by using the plasma generated in the processing container 12 and the mask MK1. Specifically, a processing gas containing a fluorocarbon gas is supplied into the processing container 12 from a gas source selected among a plurality of gas sources of the gas source group 40. Then, a high frequency power is supplied from the first high frequency power source 62. A high frequency bias power is supplied from the second high frequency power source 64. The exhaust device 50 is operated such that the pressure in the processing container 12 is set to a predetermined pressure. Thus, the plasma of the fluorocarbon gas is generated in the processing space Sp of the processing container 12. The active species containing fluorine in the generated plasma etches a region of the antireflective film AL exposed from the mask MK1. A mask ALM (second mask) is formed from the antireflective film AL by etching the antireflective film AL and used for etching the organic film OL. The mask ALM and the mask MK1 form a mask MK2. The mask MK2 is formed from the antireflective film AL by the etching performed in step ST2.

In step ST4 subsequent to step ST3, the organic film OL is etched by using the plasma generated in the processing container 12 and the mask MK2. Specifically, a processing gas containing nitrogen gas and hydrogen gas is supplied into the processing container 12 from a gas source selected among a plurality of gas sources of the gas source group 40. Then, a high frequency power is supplied from the first high frequency power source 62. A high frequency bias power is supplied from the second high frequency power source 64. The exhaust device 50 is operated such that the pressure in the processing container 12 is set to a predetermined pressure. Thus, the plasma of the processing gas containing nitrogen gas and hydrogen gas is generated in the processing space Sp of the processing container 12. Hydrogen radicals, which are active species of hydrogen in the generated plasma, etch a region exposed from the mask MK2 (mask ALM) formed from the antireflective film AL in step ST2 in the entire region of the organic film OL. A mask OLM (third mask) is formed from the organic film OL by etching the organic film OL and used for etching the etching target layer EL. The mask OLM and the mask ALM form a mask MK2. The mask MK3 is formed from the organic film OL by the etching performed in step ST3. In step ST4, a processing gas containing nitrogen gas and oxygen gas may be used instead of the processing gas containing nitrogen gas and hydrogen gas.

In step ST5 subsequent to step ST4, a silicon oxide film 341 is formed on the electrode plate 34 of the upper electrode 30. Specifically, a mixed gas containing a first gas (oxygen gas) and a second gas (argon gas) is supplied into the processing container 12 from a gas source selected among a plurality of gas sources of the gas source group 40. Then, a high frequency power is supplied from the first high frequency power source 62. A high frequency bias power is supplied from the second high frequency power source 64. A negative DC voltage is applied to the upper electrode 30 by the power source 70. The exhaust device 50 is operated such that the pressure in the processing container 12 is set to a predetermined pressure. Thus, the plasma of the mixed gas containing the first gas and the second gas is generated in the processing container 12. Specifically, the plasma of oxygen gas and the plasma of argon gas are generated in the processing space Sp of the processing container 12. Oxygen ions in the generated plasma collide with the silicon-containing electrode plate 34 due to the DC voltage applied to the upper electrode 30, and the silicon oxide film 341 is formed on the surface of the electrode plate 34. Therefore, in step ST5, the oxygen ions contained in the plasma of the first gas collide with the electrode plate 34 to than the silicon oxide film 341 on the surface of the silicon-containing electrode plate 34.

In step ST5, a silicon oxide film 341 having a necessary and sufficient thickness with respect to the electrode plate 34 is formed. In addition, in order to sufficiently maintain the width (shape) of the mask OLM (mask MK3) along with the formation of the silicon oxide film 341, the flow rate of the first gas (oxygen gas) in step ST5 may be in a range of 3 sccm to 10 sccm (hereinafter, referred to as a "range RG1"). The necessary and sufficient film thickness of the silicon oxide film 341 means a range from a film thickness necessary for protecting the silicon electrode plate 34 from the etching performed in step ST6 (lower limit) to a film thickness in which the silicon oxide film 341 is able to be removed in step ST3 in a case where step ST3 is further performed after step ST6 (e.g., a case where steps ST1 to ST3 are further performed on another wafer after step ST6 (upper limit) (hereinafter, referred to as a "range RG2"). As for the removal of the silicon oxide film 341, it is also possible to separately provide a step of performing a cleaning processing for removing the silicon oxide film 341 in method MT in order to achieve more stable mass production. Further, the range RG2 of the film thickness of the silicon oxide film 341 is also a range within which the behavior stability of the upper electrode 30 is secured. In an exemplary embodiment, the range RG2 of the film thickness of the silicon oxide film 341 formed on the surface of the electrode plate 34 in step ST5 may be, for example, 5 nm to 30 nm.

Figure 5:
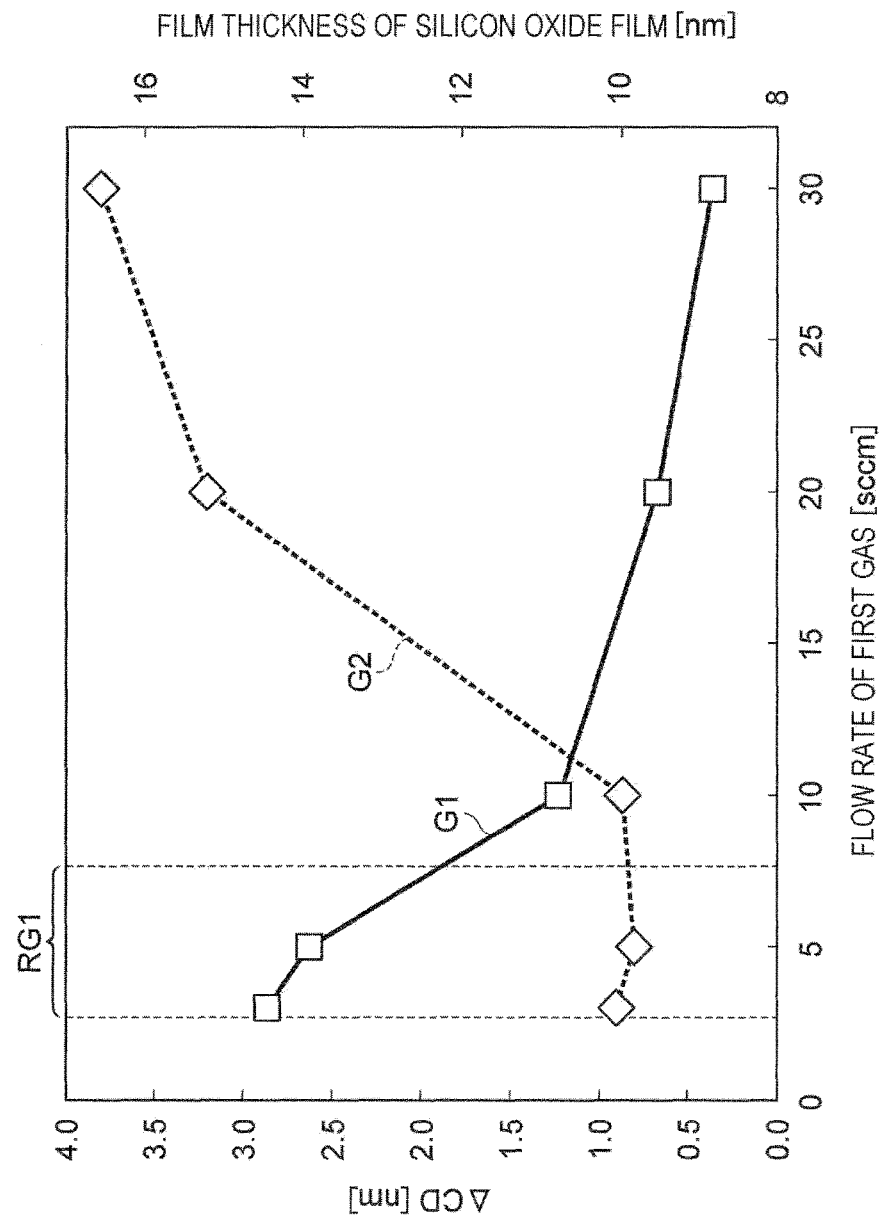
FIG. 5 is a graph illustrating a test result for explaining an effect exerted by the method illustrated in FIG. 1.

Here, descriptions will be made on a flow rate of the first gas (oxygen gas) in step ST5 with reference to FIG. 5. FIG. 5 is a graph illustrating a test result for explaining an effect exerted by method MT. The horizontal axis illustrated in FIG. 5 represents a flow rate [sccm] of the first gas. The vertical axis on the left side in FIG. 5 represents a change in width KW (ΔCD [nm]) of the mask MK3 illustrated in FIG. 2C before and after step ST5, and the vertical axis on the right side in FIG. 5 represents a film thickness [nm] of the silicon oxide film 341 formed in unit time (e.g., 1 second). The ΔCD [nm] is an average value (average value of a plurality of portions on the wafer W) of values obtained by subtracting a value of the width KW after execution of step ST5 from a value of the width KW before the execution of step ST5, and represents a change in width (shape) of the mask OLM before and after the execution of step ST5.

FIG. 5 illustrates two kinds of test results G1 and G2. The test result G1 is a test result on a correlation between the flow rate [sccm] of the first gas (the amount of the horizontal axis illustrated in FIG. 5) and the film thickness [nm] of the silicon oxide film 341 formed in unit time (the amount of the vertical axis on the right side in FIG. 5). The test result G2 is a test result on a correlation between the flow rate [sccm] of the first gas (the amount on the horizontal axis illustrated in FIG. 5) and the ΔCD [nm] (the amount of the vertical axis on the left side in FIG. 5). As seen from the test result G1, as the flow rate of the first gas decreases, the film thickness of the silicon oxide film 341 formed in unit time increases (negative correlation). As a cause of the negative correlation, for example, it may be considered that as the flow rate of the first gas increases, the plasma density decreases due to the first gas. In addition, as seen from the test result G2, as the flow rate of the first gas decreases, the ΔCD [nm] decreases (positive correlation).

As illustrated in FIG. 5, when the flow rate of the first gas in step ST5 falls within the range RG1, ΔCD is less than 1 nm, and the film thickness of the silicon oxide film 341 formed in unit time is greater than 1.6 nm. Therefore, as illustrated in FIG. 5, the range of the flow rate of the first gas such that the film thickness of the silicon oxide film 341 formed in unit time is sufficiently large and the ΔCD is sufficiently small may be the range RG1. When the flow rate of the first gas falls within the range RG1, the film thickness of the silicon oxide film 341 may be a value within the range RG2.

Further, in step ST5, as the negative DC voltage applied to the upper electrode 30 increases, the film thickness of the silicon oxide film 341 formed in unit time in step ST5 increases (positive correlation). Therefore, a relatively high negative DC voltage of, for example, about −1,500 V is applied to the upper electrode 30.

FIG. 1 is referred to again. In step ST6 subsequent to step ST5, the etching target layer EL is etched by using the plasma generated in the processing container 12 and the mask MK3. Specifically, a processing gas containing a halogen gas (halogen-containing gas) is supplied into the processing container 12 from a gas source selected among a plurality of gas sources of the gas source group 40. In this case, the halogen-containing gas may be selected from, for example, HBr gas, $Cl_2$ gas, $SF_6$ gas, $BCl_3$ gas, and $NF_3$ gas. Then, a high frequency power is supplied from the first high frequency power source 62. A high frequency bias power is supplied from the second high frequency power source 64. The exhaust device 50 is operated such that the pressure in the processing container 12 is set to a predetermined pressure. Accordingly, plasma is generated. Active species in the generated plasma etch a region exposed from the mask MK3

(mask OLM) formed in step ST2 in the entire region of the etching target layer EL. In the etching processing performed in step ST6, the influence on the silicon oxide film 341 formed in step ST5 may be sufficiently suppressed.

According to method MT described above, the silicon oxide film 341 is formed on the electrode plate 34 of the upper electrode 30 by step ST5 executed during the period from step ST3 of etching the antireflective film AL to step ST6 of etching the etching target layer EL. Thus, it is unnecessary to previously provide a step of forming the silicon oxide film 341 on the electrode plate 34 of the upper electrode 30 before execution of step ST3. In addition, it is unnecessary to prepare another wafer used for forming a silicon oxide film on the electrode plate of the upper electrode, in addition to the wafer subjected to, for example, step ST3. Further, it is possible to avoid any influence on a seasoning process to be performed before the execution of step a. Further, since oxygen ions collide with the silicon-containing electrode plate 34 in accordance with the DC voltage applied from the electrode plate 34, oxygen ions are selectively supplied to the electrode plate 34. Therefore, it is possible to reduce the influence of oxygen ions on other parts in the processing container 12 other than the electrode plate 34. In addition, it is possible to reduce variations in film thickness of the silicon oxide film 341 formed on the electrode plate 34.

Further, according to method MT described above, when the flow rate of the first gas is in a range of 3 sccm to 10 sccm, it is possible to form the silicon oxide film 341 relatively thick on the electrode plate 34 and reduce the influence of the oxygen ions from the plasma of the first gas on the mask OLM (organic film).

Further, according to method MT described above, oxidation of silicon in the electrode plate 34 may be effectively performed by using the second gas which is argon gas together with the first gas which is oxygen gas.

Further, according to method MT described above, the film thickness of the silicon oxide film 341 that may be formed in step ST5 is equal to or greater than the film thickness necessary for protecting the electrode plate 34 in the etching processing of step ST6 and is equal to or less than the film thickness to be removed in step ST3 when step ST3 is further executed after step ST6. Thus, the silicon oxide film 341 may be used as a protective film, and the silicon oxide film 341 may be efficiently removed after use.

Examples of the respective process conditions of step ST3 and step ST5 are shown below.

<Step ST3>
Pressure in the processing container 12: 50 mTorr
High frequency power of the first high frequency power source 62: 500 W
High frequency power of the second high frequency power source 64: 500 W
DC voltage of the power source 70: 0 V
Processing gas: $CF_4$ gas
Flow rate of the processing gas: 600 sccm
Processing time: 30 s
<Step ST5>
Pressure in the processing container 12: 20 mTorr
High frequency power of the first high frequency power source 62: 200 W
High frequency power of the second high frequency power source 64: 0 W
DC voltage of the power source 70: −900 V
Processing gas: $O_2$/Ar gas
Flow rate of the processing gas: ($O_2$ gas) 5 sccm, (Ar gas) 800 sccm
Processing time: 15 s From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing method for processing a workpiece that includes a silicon-containing etching target layer, an organic film provided on the etching target layer, an antireflective film provided on the organic film, and a first mask provided on the antireflective film, using a plasma processing apparatus that includes a processing container, the plasma processing method comprising:
generating a first plasma in the processing container;
etching the antireflective film using the first plasma generated in the processing container and the first mask to form a second mask from the antireflective film;
etching the organic film using the first plasma generated in the processing container and the second mask to form a third mask from the organic film;
generating a second plasma of a mixed gas including a first gas and a second gas in the processing container; and
etching the etching target layer using the second plasma generated in the processing container and the third mask,
wherein the plasma processing apparatus further includes an upper electrode,
the upper electrode is provided above a placing table that supports the workpiece in the processing container,
an electrode plate of the upper electrode contains silicon,
the first gas is oxygen gas, and
after generating the second plasma of the mixed gas and before etching the etching target layer using the second plasma, a silicon oxide film is formed on a surface of the electrode plate by colliding oxygen ions contained in the second plasma of the first gas with the electrode plate.

2. The plasma processing method of claim 1, wherein, in the generating the second plasma of the mixed gas, a flow rate of the first gas is 3 sccm to 10 sccm.

3. The plasma processing method of claim 1, wherein the second gas is argon gas.

4. The plasma processing method of claim 1, wherein the antireflective film contains silicon oxide, and
a film thickness of the silicon oxide film formed in the generating the second plasma of the mixed gas is a film thickness of the silicon oxide film to be removed in the etching the antireflective film when the etching the antireflective film is further performed after the etching the etching target layer.

5. A plasma processing method for processing a workpiece that includes a silicon-containing etching target layer, an organic film provided on the etching target layer, an antireflective film provided on the organic film, and a first mask provided on the antireflective film, using a plasma processing apparatus that includes a processing container, the plasma processing method comprising:
generating a first plasma in the processing container;
etching the antireflective film using the first plasma generated in the processing container and the first mask to form a second mask from the antireflective film;

etching the organic film using the first plasma generated in the processing container and the second mask to form a third mask from the organic film;

generating a second plasma of a mixed gas including a first gas and a second gas in the processing container; and etching the etching target layer using the second plasma generated in the processing container and the third mask, wherein the plasma processing apparatus further includes an upper electrode, the upper electrode is provided above a placing table that supports the workpiece in the processing container, an electrode plate of the upper electrode contains silicon, the first gas is oxygen gas, and a silicon oxide film is formed on a surface of the electrode plate by colliding oxygen ions contained in the second plasma of the first gas with the electrode plate, and wherein the antireflective film contains silicon oxide.

6. The plasma processing method of claim 5, wherein a film thickness of the silicon oxide film formed in the generating the second plasma of the mixed gas is a film thickness of the silicon oxide film to be removed in the etching the antireflective film when the etching the antireflective film is further performed after the etching the etching target layer.

* * * * *